(12) United States Patent
Fabbri et al.

(10) Patent No.: US 11,082,000 B2
(45) Date of Patent: Aug. 3, 2021

(54) THERMOPHOTOVOLTAIC PANEL AND A METHOD FOR MAKING A THERMOPHOTOVOLTAIC PANEL

(71) Applicant: ALMA MATER STUDIORUM UNIVERSITA DI BOLOGNA, Bologna (IT)

(72) Inventors: Giampietro Fabbri, Bologna (IT); Matteo Greppi, Forlì (IT); Paolo Proli, Forlì (IT)

(73) Assignee: Alma Mater Studiorum Universita Di Bologna, Bologna (IT)

( * ) Notice: Subject to any disclaimer, the term of this patent is extended or adjusted under 35 U.S.C. 154(b) by 0 days.

(21) Appl. No.: 16/337,807

(22) PCT Filed: Oct. 9, 2017

(86) PCT No.: PCT/IT2017/000218
§ 371 (c)(1),
(2) Date: Mar. 28, 2019

(87) PCT Pub. No.: WO2018/069946
PCT Pub. Date: Apr. 19, 2018

(65) Prior Publication Data
US 2019/0238084 A1    Aug. 1, 2019

(30) Foreign Application Priority Data
Oct. 10, 2016    (IT) .................. 102016000101227

(51) Int. Cl.
*H02S 10/30* (2014.01)
*H01L 31/052* (2014.01)
*H02S 40/42* (2014.01)

(52) U.S. Cl.
CPC ............ *H02S 10/30* (2014.12); *H01L 31/052* (2013.01); *H02S 40/42* (2014.12)

(58) Field of Classification Search
CPC .............................. H02S 10/30; H01L 31/052
See application file for complete search history.

(56) References Cited

U.S. PATENT DOCUMENTS

2005/0161074 A1\*  7/2005  Garvison ............... H02S 40/44
                                                136/246
2010/0163098 A1    7/2010  Clemens et al.
(Continued)

FOREIGN PATENT DOCUMENTS

CN    102844899 A    12/2012
CN    102856410 A     1/2013
(Continued)

OTHER PUBLICATIONS

Chinese Office Action dated Oct. 28, 2019 for Chinese Patent Application No. 201780062536.8.
(Continued)

*Primary Examiner* — Shannon M Gardner
(74) *Attorney, Agent, or Firm* — Shuttleworth & Ingersoll, PLC; Timothy Klima

(57) ABSTRACT

A thermophotovoltaic panel, including a first surface for receiving solar radiation, photovoltaic cells connected to said first receiving surface, a heat exchanger connected to said photovoltaic cells, and a second surface, opposite to the first, for supporting the panel, said heat exchanger being positioned between said first receiving surface and said second supporting surface, wherein said photovoltaic cells and said exchanger are embedded in at least one resin, preferably cold-polymerised epoxy resin, to constitute a body including said first receiving surface and said second supporting surface, wherein at least one layer of resin at said first receiving surface is constituted of substantially transparent resin.

18 Claims, 8 Drawing Sheets

(56) References Cited

U.S. PATENT DOCUMENTS

2010/0224234 A1* 9/2010 Fischer .............. F24D 11/0221
136/248
2013/0278063 A1  10/2013 Fowler

FOREIGN PATENT DOCUMENTS

| CN | 204131464 U | 1/2015 |
| CN | 105940281 A | 9/2016 |
| EP | 2197041 A1  | 6/2010 |
| EP | 3523876 A1  | 8/2019 |

OTHER PUBLICATIONS

International Search Report and Written Opinion dated Feb. 12, 2018 for counterpart PCT Application No. PCT/IT2017/000218.
Chinese Office Action dated Jun. 24, 2020 from counterpart Chinese Patent Application No. 201780062536.8.

* cited by examiner

THERMOPHOTOVOLTAIC PANEL AND A METHOD FOR MAKING A THERMOPHOTOVOLTAIC PANEL

This application is the National Phase of International Application PCT/IT2017/000218 filed Oct. 9, 2017 which designated the U.S.

This application claims priority to Italian Patent Application No. 102016000101227 filed Oct. 10, 2016, which application is incorporated by reference herein.

TECHNICAL FIELD

This invention relates to a thermophotovoltaic panel and a method for making a thermophotovoltaic panel.

BACKGROUND ART

In the field of the use of solar radiation for producing energy, both solar panels, for obtaining heat energy for heating, and photovoltaic panels, for directly obtaining electric energy have been known for some time.

More recently thermophotovoltaic panels have been developed, so called "hybrid", for simultaneously producing both heat energy and electric energy.

Such panels are constituted of photovoltaic cells connected to a heat exchanger, which allows cooling of the photovoltaic cells, increasing their efficiency, and the simultaneous supplying of a fluid for heating.

In prior art thermophotovoltaic panels, the photovoltaic cells are equipped with a glass cover that is exposed to the solar radiation. The panels are also usually equipped with an insulating surface that is fixed to the exchanger. Such panels are positioned on suitable supporting structures that are usually installed on the roofs of homes. Hydraulic connections are made using threaded fittings.

In some situations the use of panels of this type may involve several problems.

In the nautical sector, for example, the panel is not impermeable enough and in any case requires a supporting structure whose dimensions are significant compared with the space available. The problem of the space available is also encountered if one wants to install thermophotovoltaic panels on vehicles such as camper vans or caravans or in homes whose roof is not suitable or in any case not available for the installation of panels.

DISCLOSURE OF THE INVENTION

The aim of the present invention is to provide a thermophotovoltaic panel that can be used for various applications, even those in which space is limited.

According to the present invention, a thermophotovoltaic panel is provided, having features as disclosed herein.

Making the panel using at least one resin in which the photovoltaic cells and the heat exchanger are embedded to constitute a resin body allows the panel to be rendered impermeable and therefore allows it to be used even for applications other than residential ones. Moreover, the substantially transparent resin used at the surface connected to the photovoltaic cells has excellent optical properties in terms of transmission of the incident solar radiation. The resin also has mechanical-structural properties that allow the panel to be walked on. Therefore, it is possible to install the panel also in a horizontal position in flooring, a terrace or a flat roof. The use of a resin in the panel supporting surface not only constitutes a very strong load-bearing structure, but also allows easy production of different panel profiles depending on the applications.

Advantageously, at least one layer of resin at the second supporting surface is constituted of resin with thermal insulating properties, preferably an opaque resin. The surface made of resin with thermal insulating properties constitutes built-in thermal insulation that allows optimisation of the heat exchange and therefore of panel performance.

Preferably, the layer of substantially transparent resin surrounds the photovoltaic cells, in such a way as to maximise the surface of incidence of the solar radiation on the photovoltaic cells.

Advantageously, the layer of resin with thermal insulating properties at least partly surrounds the heat exchanger, in order to optimise the thermal insulation of the exchanger.

According to a preferred embodiment, the heat exchanger comprises at least one central body, preferably made of aluminium alloy, equipped with flow channels for a fluid, in such a way as to improve the heat exchange and simultaneously guarantee a strong structure, even when inserted in flooring.

Preferably, the heat exchanger comprises a plurality of central bodies that are adjacent and fixed to each other. Therefore, the exchanger is modular and can be made by simply drawing the central bodies near each other depending on the dimensions of the panel, without the need to use gaskets. Moreover, the exchanger can easily be recycled if the panel has to be substituted.

Advantageously, the heat exchanger comprises a first closing manifold connected to a first end of the central body or of a first central body and a second closing manifold connected to a second end of the central body or of a final central body, wherein the first and/or second manifold has a substantially trapezoidal cross-section. That configuration guarantees a greater flow cross-section at the points where the flow rate is greater, to promote more even distribution of the fluid in the exchanger.

In a preferred embodiment the exchanger comprises at least one intermediate body positioned between a central body and an end body, wherein the end body constitutes the manifold and is equipped with an infeed hole for a fluid and wherein the intermediate body is equipped with flow channels for the fluid. In another preferred embodiment the exchanger comprises a first end body and a second end body, wherein the first and/or the second end body comprises a first portion having a substantially triangular cross-section and equipped with channels and a second portion having a substantially triangular cross-section and equipped with an infeed hole for the fluid. Those embodiments allow extension of the channels in the closing zone and at the same time collection of more fluid at the infeed pipe.

According to a preferred embodiment, the panel is configured as a floor tile or a roofing tile, in which preferably the second supporting surface comprises at least one groove designed to constitute a seat for pipes or supports to be connected to the panel.

Advantageously, the panel comprises at least one electric contact, in particular two electric contacts, and/or at least one hydraulic coupling, in particular two hydraulic couplings, at least partly positioned in the second supporting surface.

According to another aspect of this invention, a method for making a thermophotovoltaic panel comprises features as disclosed herein.

Unlike the prior art panels, in which the components are assembled by means of fixing elements such as screws, in the method according to the invention it is possible to assemble and seal the components by pouring at least one resin into a mould whose geometry corresponds to the final shape of the panel.

According to a preferred embodiment, the method comprises pouring a first resin, preferably a resin with thermal insulating properties, waiting for the first resin to solidify, and pouring a second resin that is substantially transparent, in such a way as to make of resin both the transparent portion of the panel and the thermal insulation.

Advantageously, the mould comprises at least one removable element for making panels of different sizes.

BRIEF DESCRIPTION OF THE DRAWINGS

Further advantages and features of the present invention are more apparent in the detailed description which follows, with reference to the accompanying drawings, which illustrate an example of it without limiting the scope of the invention, in which.

DETAILED DESCRIPTION OF PREFERRED EMBODIMENT OF THE INVENTION

Figure 1:
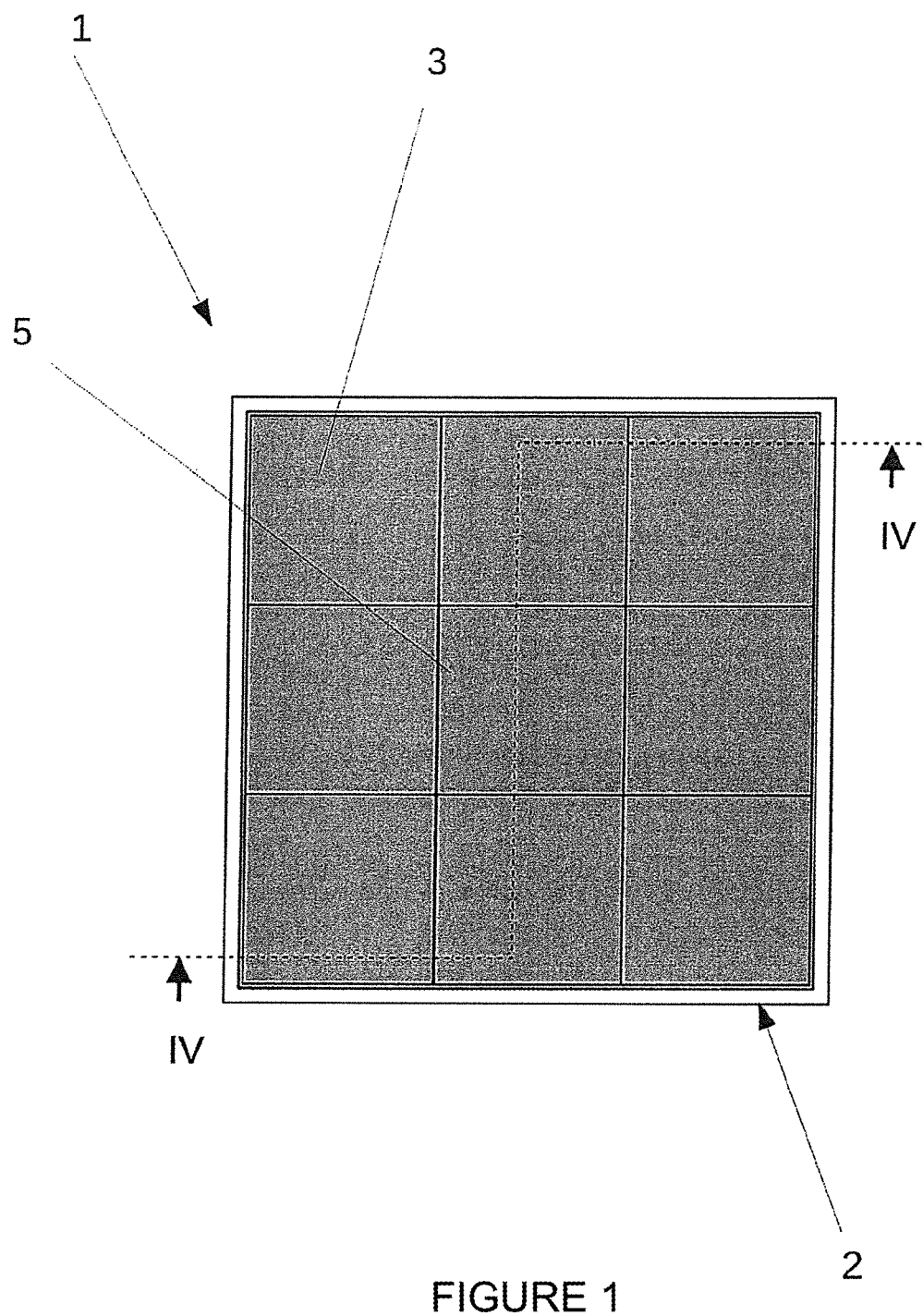
FIG. 1 is a top view of a thermophotovoltaic panel according to a preferred embodiment of the invention
Figure 4:
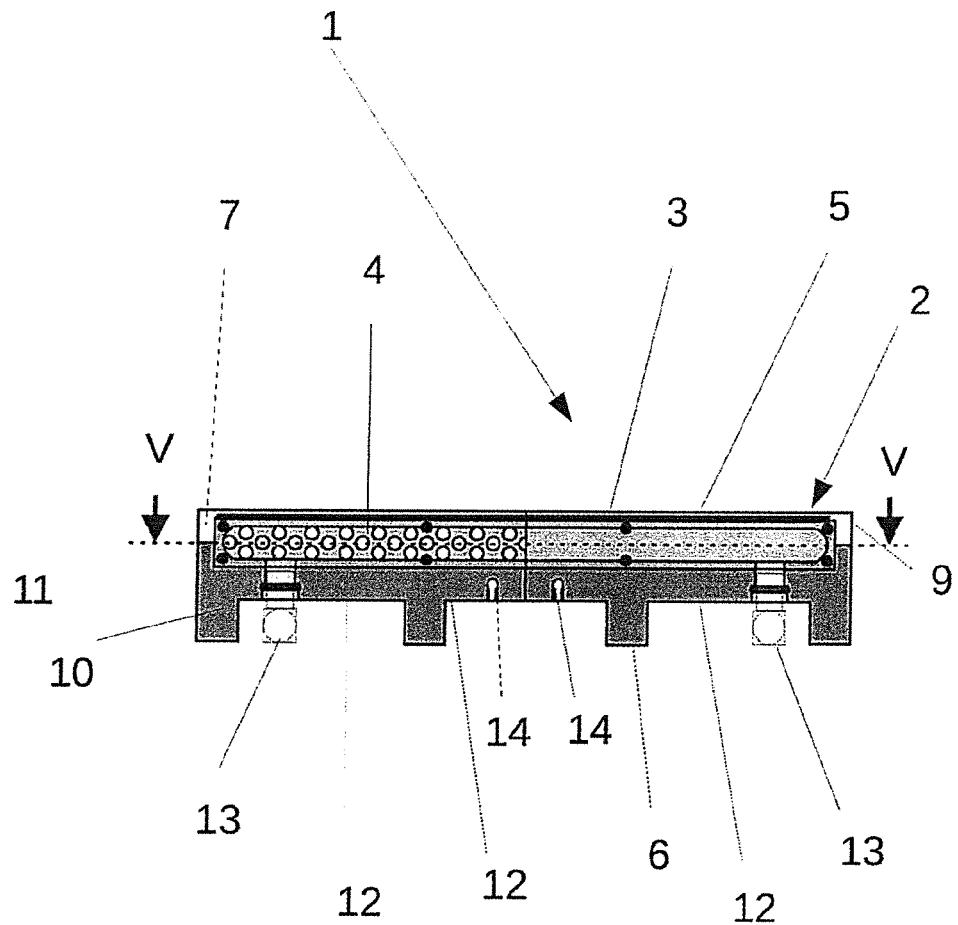
FIG. 4 is a cross-section of the thermophotovoltaic panel of FIG. 1 according to the line IV-IV

In FIG. 1 the numeral 1 denotes a thermophotovoltaic panel according to a preferred embodiment of the invention shown in top view. According to the invention, the panel 1 comprises a body 2 constituted of at least one resin in which there are embedded photovoltaic cells 3 connected to a heat exchanger 4, illustrated in FIGS. 4, 5, 6 and 7. The resin body 2 comprises a first surface 5 to which the photovoltaic cells 3 are connected, the latter being designed to receive solar radiation and convert it into electric energy. The photovoltaic cells 3 are preferably made of monocrystalline silicon. Preferably the resin is a cold-polymerised epoxy resin. The photovoltaic cells 3 are connected to the heat exchanger 4 for example by means of silicone paste with high thermal conductivity. As shown in FIG. 4, the heat exchanger 4 is positioned between the first receiving surface 5 and a second supporting surface 6 of the panel 1, opposite to the first. According to the invention the resin body 2 comprises the first receiving surface 5 for receiving the solar radiation and the second supporting surface 6. At the first surface 5 the body 2 has a first layer 7 of substantially transparent resin.

Preferably, the transparent resin is constituted of two components, wherein the first component is constituted of a very liquid epoxy resin that is solvent-free and derived from hydrogenation of bisphenol, whilst the second component is a hardener. Preferably, the mix ratio by weight of the first component relative to the second is 100:25. That resin has the property of not turning yellow during use.

Figure 2:
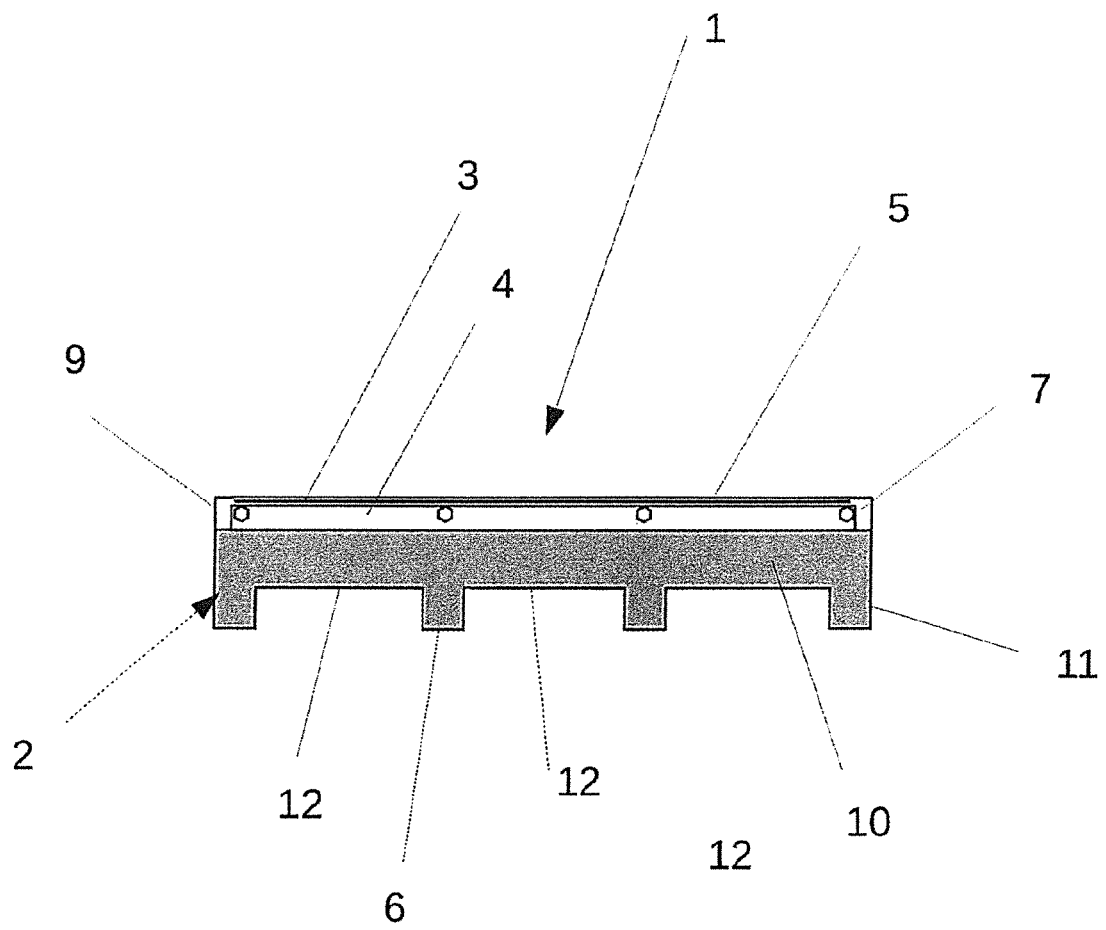
FIG. 2 is a front view of the thermophotovoltaic panel of FIG. 1

As can be seen in the embodiment of FIGS. 2 and 4, the layer 7 of transparent resin surrounds the photovoltaic cells 3, therefore also constituting a first part 9 of the lateral walls of the panel 1. The layer 7 of transparent resin allows excellent transmission of the incident solar radiation and, thanks to high mechanical-structural strength, allows the panel to be walked on.

In the embodiment illustrated in the figures, at the second supporting surface 6 the body 2 comprises a layer 10 of resin with thermal insulating properties, preferably an opaque resin. More preferably, the opaque resin is a two-component resin, in which the first component is constituted of an epoxy resin and the second component is a hardener. Preferably, the mix ratio by weight of the first component relative to the second is 100:10. Advantageously, the two-component epoxy resin is loaded with embedded fillers in powder form. It is also solvent-free and does not shrink. The degree of thermal insulation depends on the percentage of insulating material loaded and embedded in powder form.

As shown in FIGS. 2 and 4, the layer of opaque resin 10 at least partly surrounds the exchanger 4 and extends in such a way as to constitute a second part 11 of the lateral walls of the panel. The opaque resin improves the thermal insulation of the exchanger 4 and at the same time allows easy production of specific profiles of the second supporting surface 6 of the panel. Moreover, making the second surface 6 using resin allows the preparation of channels for the passage of hydraulic and electric connections.

Figure 3:
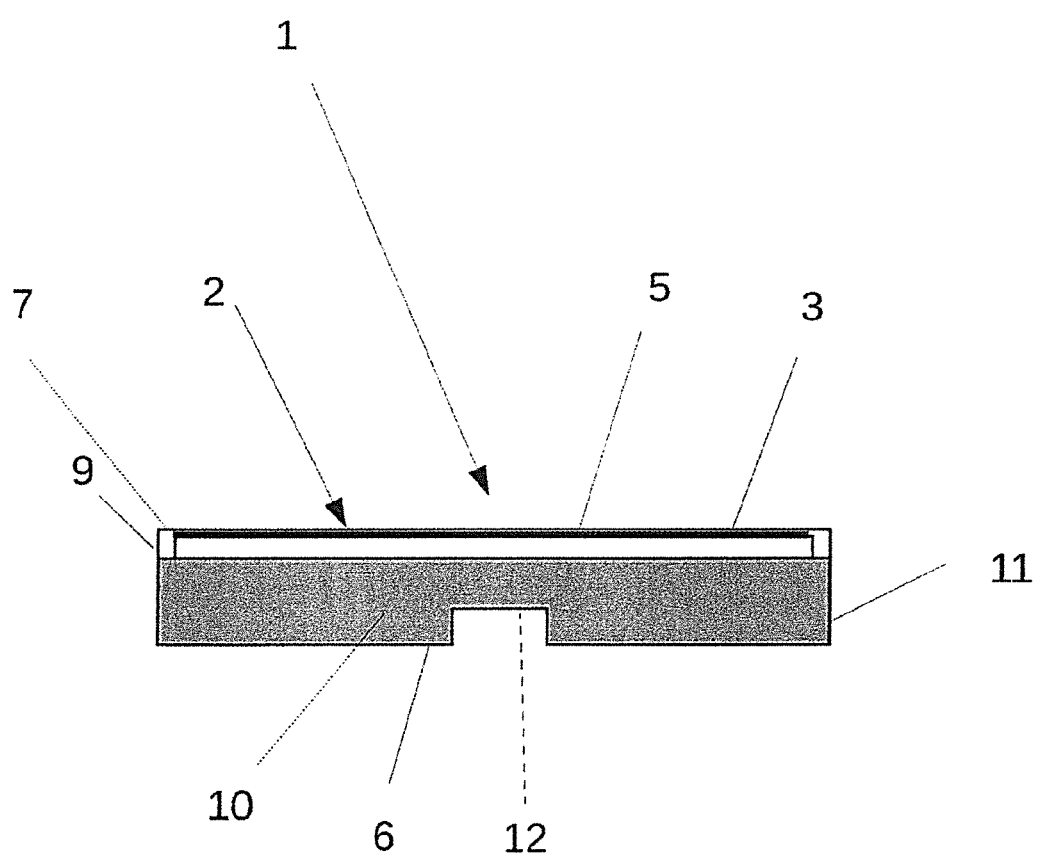
FIG. 3 is a side view of the thermophotovoltaic panel of FIG. 1

Advantageously, the thermophotovoltaic panel 1 is configured as a floor tile or a roofing tile, and does not require a specific supporting structure, since the resin constitutes the panel supporting structure. As shown in FIGS. 2 and 3, the second supporting surface 6 of the panel 1 comprises one or more grooves 12 for simplifying panel 1 installation on pipes already in place under the flooring or under the roof.

As illustrated in FIG. 4, the panel 1 advantageously comprises one or more couplings 13 partly embedded in the resin at the second supporting surface 6. The couplings 13 are preferably of the bayonet type with O-ring gaskets, for quickly making the hydraulic connections. Installation therefore consists of simply fitting the tile on the pipes resting on the ground or on the roof. In the embodiment illustrated in FIG. 4, one or more electric sockets 14 are embedded in the second surface 6 for facilitating electric connections.

The panel 1 may have a rectangular or square shape, with sides whose size is between 200 mm an 800 mm, and a thickness of between 20 mm and 100 mm. The panel 1 is preferably square and has an exposed surface measuring 500 mm×500 mm with a thickness of 40 mm. Even more preferably the panel 1 has an exposed surface measuring 400 mm×400 mm with a thickness of 80 mm, equal to the thickness of common self-locking tiles.

The thermophotovoltaic panel 1 according to the invention allows temperatures to be kept at around 30° C., much lower than the temperatures reached by the widely used photovoltaic solar panels in operation (up to 70° C.), which therefore could not be walked on. Moreover, the weight of the panel is comparable with that of a classic thermophotovoltaic panel, and therefore does not cause transportation and installation difficulties.

Moreover, the thermophotovoltaic panel 1 according to the invention does not require maintenance, since the whole body 2 can be substituted without incurring costs greater than maintenance involving panel disassembly and substitution of components.

Figure 5:
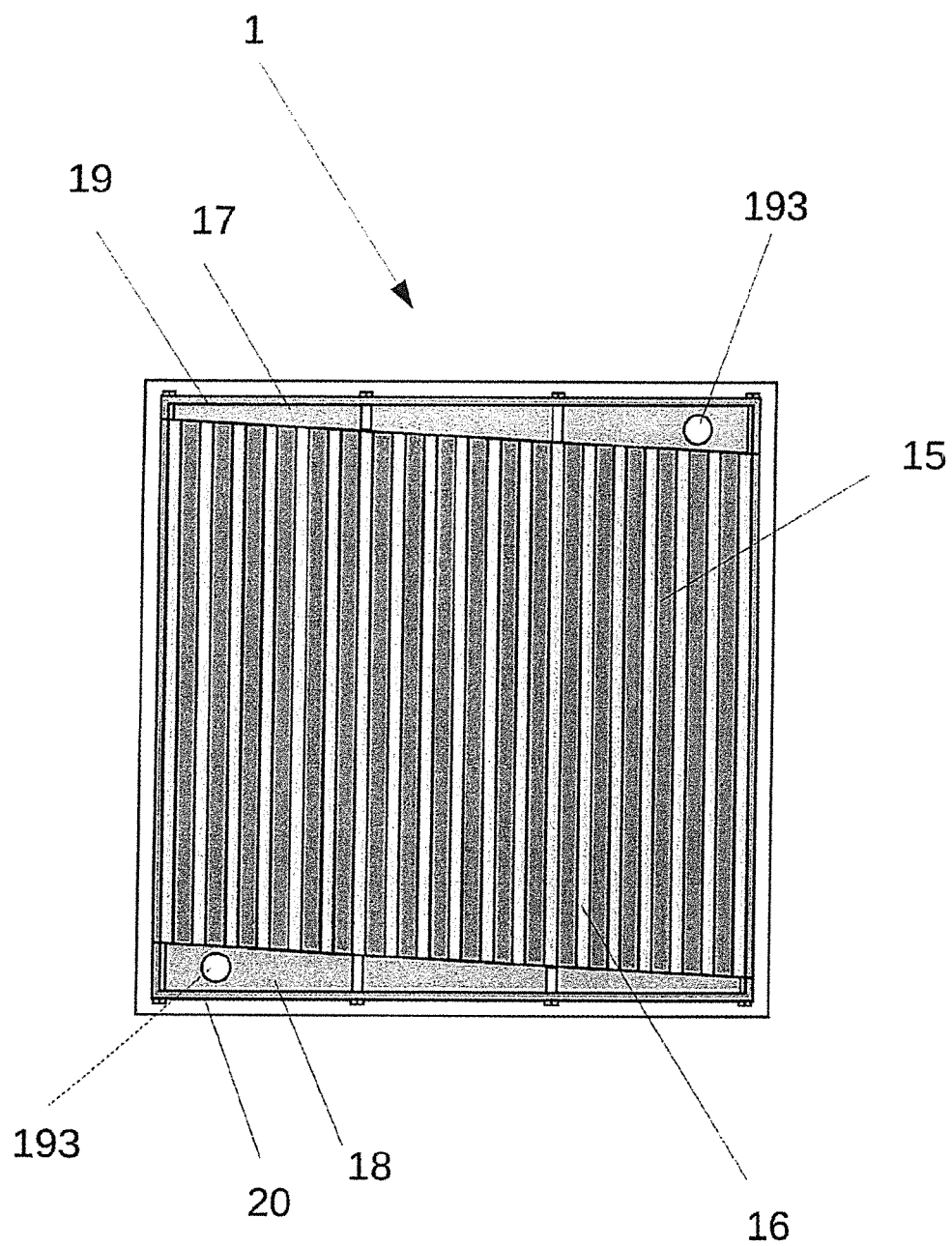
FIG. 5 is a cross-section of the thermophotovoltaic panel of FIG. 4 according to the line V-V

FIG. 5 illustrates an advantageous embodiment of the heat exchanger 4, which comprises a central body 15, preferably made of aluminium alloy, equipped with channels 16, and two closing manifolds 17, 18, each connected to one end 19, 20 of the central body 15. The configuration of the central body 15 of the exchanger 4 is particularly sturdy and is suitable for use in a panel that can be walked on. The central body 15 is preferably made by extrusion. The closing manifolds 17, 18 advantageously have a trapezoidal cross-section with a greater flow cross-section at a respective fluid infeed hole 193, that is to say, at the points where the flow rate is greater, to promote more even distribution of the fluid in the exchanger, thereby improving heat exchange.

In an advantageous embodiment, the exchanger comprises a plurality of central bodies 15 that are adjacent to each other, in which one end of a first central body is connected to a first a first manifold 17 and one end of a final central body is connected to a second closing manifold 18. The exchanger 4 is therefore a modular exchanger whose size is defined based on the applications.

Figure 6:
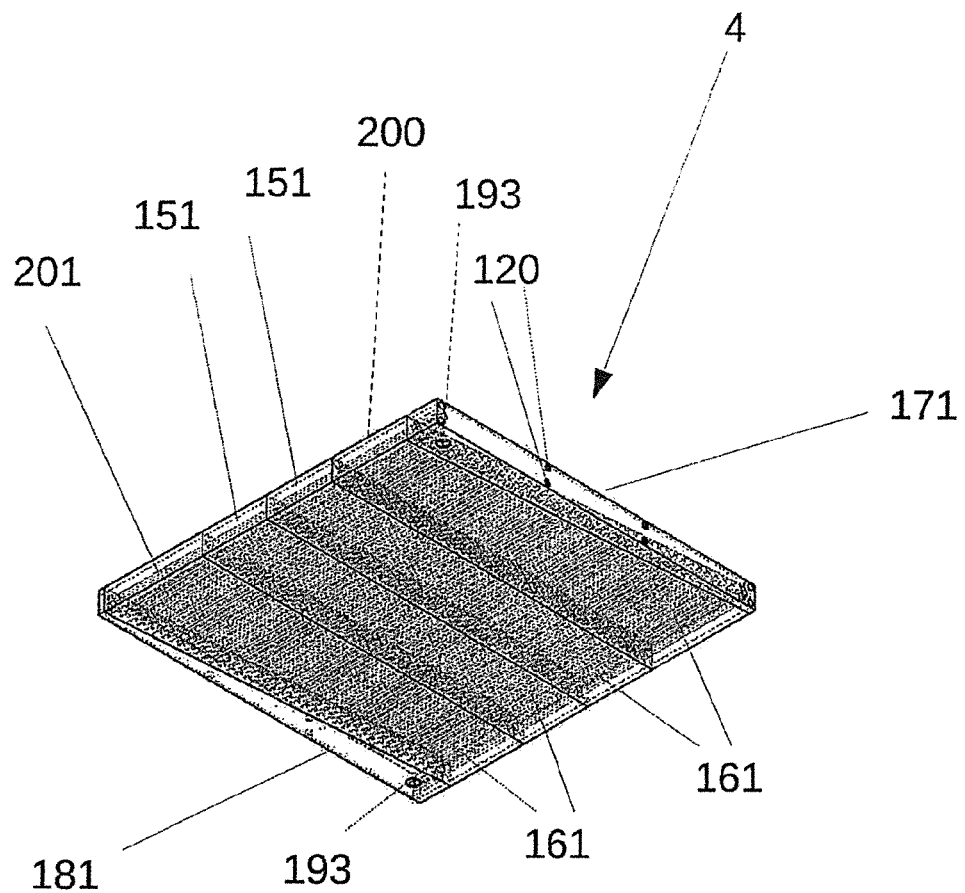
FIG. 6 is a perspective view of a preferred embodiment of the heat exchanger

In the embodiment illustrated in FIG. 6, the exchanger comprises a plurality of central bodies 151 that are adjacent to each other, two end bodies 171, 181 that constitute the closing manifolds 17, 18 with substantially trapezoidal cross-section, and two intermediate bodies 200, 201. Each intermediate body 200, 201 is positioned between a central body 151 and a respective end body 171, 181 and has a substantially trapezoidal cross-section. The central bodies 151, the end bodies 171, 181 and the intermediate bodies 200, 201 are preferably made of aluminium alloy, advantageously by extrusion. Flow channels 161 for the fluid are made in the central bodies 151 and in the intermediate bodies 200, 201. The end bodies 171, 181 are equipped with a respective infeed hole 193 for the fluid and do not comprise flow channels for the fluid. The configuration of the intermediate bodies 200, 201 and of the end bodies 171, 181 allows extension of the channels even in the closing zone, in any case in the end bodies 171, 181 making a flow cross-section that is greater at the points where the flow rate is greater, thereby improving heat exchange.

The central bodies 151, the intermediate bodies 200, 201 and the end bodies 171, 181 of the exchanger are simply drawn near each other and fixed by means of screws 120. Moreover, the central bodies 151, the intermediate bodies 200, 201 and the end bodies 171, 181 are sealed to each other by means of the resin, without the need for gaskets.

Figure 7:
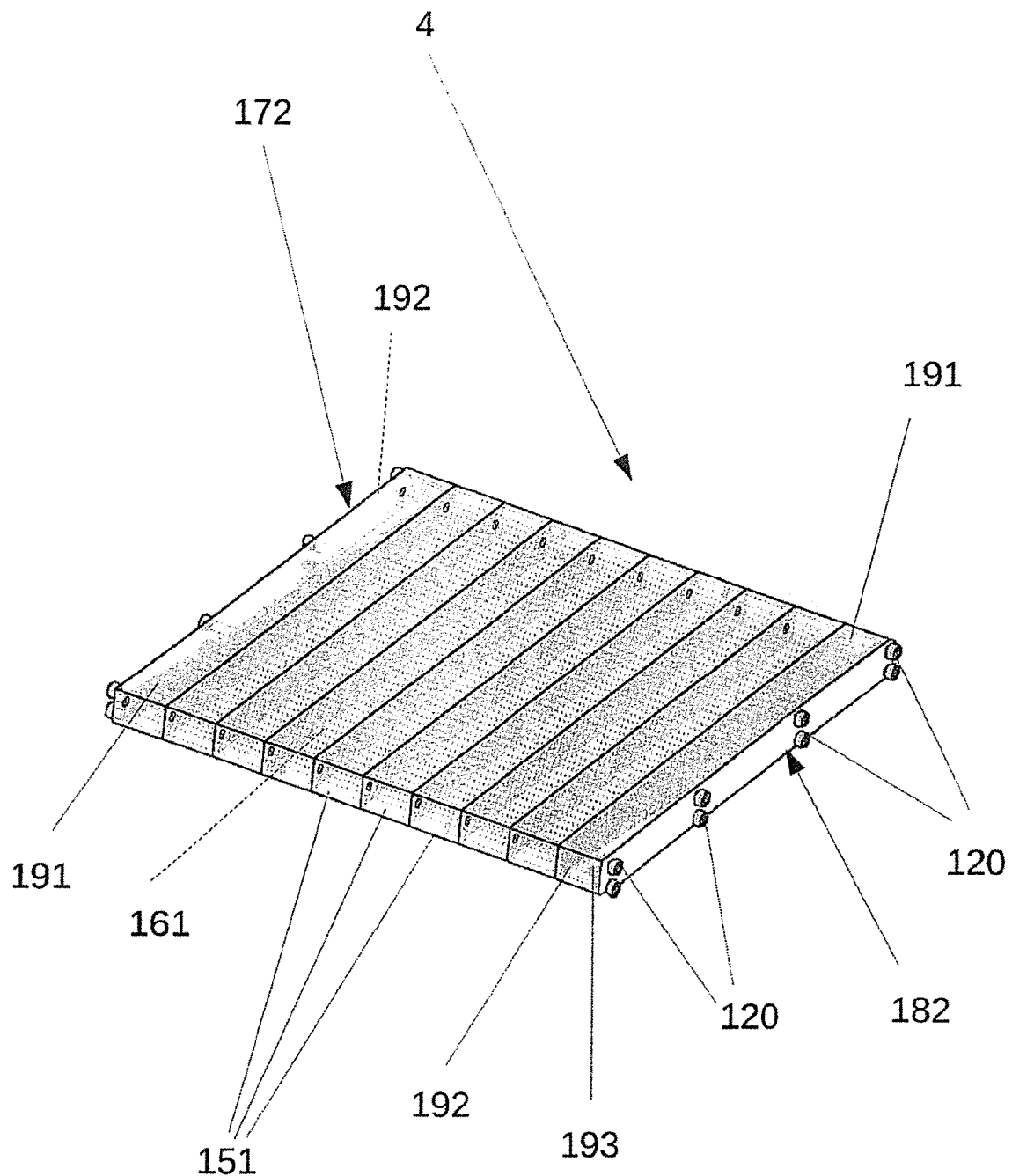
FIG. 7 is a perspective view of an alternative embodiment of the heat exchanger

In an alternative embodiment, illustrated in FIG. 7, the exchanger comprises a plurality of central bodies 151 that are adjacent to each other, and two end bodies 172, 182, preferably made of aluminium alloy.

Each central body 151 is equipped with channels 161 and preferably made by extrusion. Each end body 172, 182 is substantially constituted of a parallelepiped internally divided into two portions with substantially triangular cross-section, a first portion 191 equipped with channels 161 and a second portion 192 comprising an infeed hole 193 for the fluid. The special way in which the end bodies 172, 182 are made allows the channels to be extended even in the closing zone and guarantees a flow cross-section that is greater at the points where the flow rate is greater, promoting more even distribution of the fluid in the exchanger, thereby improving heat exchange.

The central bodies 151 and the end bodies 172, 182 are drawn near each other and fixed by means of screws 120, and are sealed to each other by means of the resin.

According to the present invention, the method for making a thermophotovoltaic panel comprises the steps of: making a mould 21, placing a heat exchanger 4 and photovoltaic cells 3 in the mould 21, cold pouring at least one resin into the mould, removing the panel 1 from the mould 21.

Figure 8:
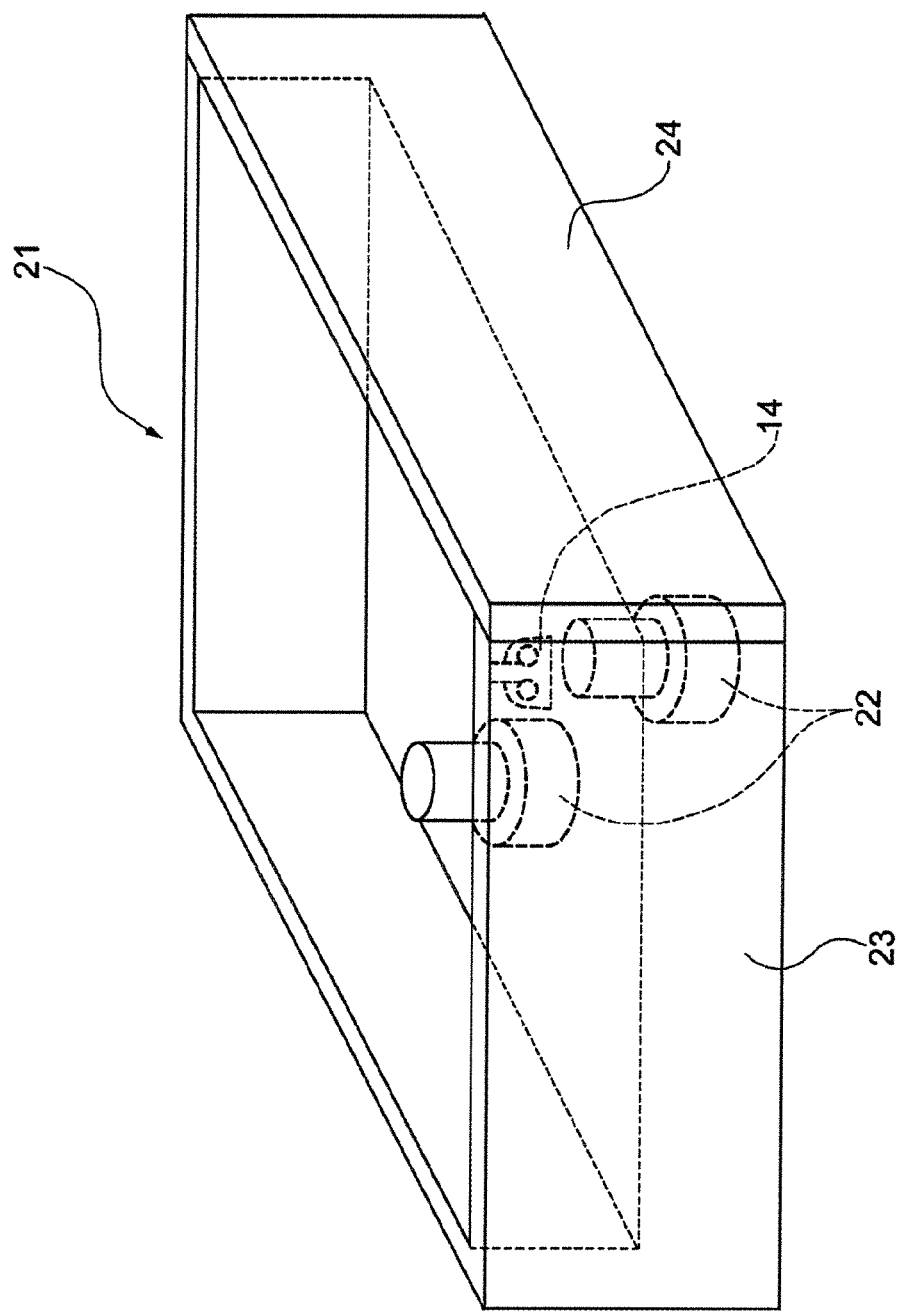
FIG. 8 illustrates a preferred embodiment of a mould for implementing the method according to the invention.

The mould 21, schematically illustrated in FIG. 8, is advantageously made according to the geometry of the panel 1, and appropriately equipped with grooves or supports for the elements to be inserted in the panel.

The exchanger 4 is inserted in the mould 21 already connected to the photovoltaic cells 3 or alternatively the exchanger 4 is inserted first and then the photovoltaic cells 3 are connected to it inside the mould. Preferably, the exchanger 4 is inserted on suitable supports 22 made in the mould 21. Then the resin is poured. When the resin has solidified, the panel 1 is removed from the mould 21.

By means of that method it is possible to make both a panel in which the resin completely surrounds the exchanger and a panel in which the resin surrounds the wall connected to the photovoltaic cells and the lateral walls of the exchanger.

In a preferred embodiment, first a resin with thermal insulating properties, preferably an opaque resin, is cold-poured in order to constitute the suitably shaped second supporting surface 6 of the panel 1. The opaque resin is allowed to solidify and then a substantially transparent resin is cold-poured, in such a way as to obtain a layer 7 with desired thickness at the photovoltaic cells 3.

In an advantageous embodiment, before pouring the resin one or more electric sockets 14 are inserted in the mould 21, the sockets being at least partly embedded in the second supporting surface 6, in order to facilitate direct electric connections. Similarly, one or more couplings 13 for the hydraulic connections of the panel can be inserted in the mould 21 before pouring the resin.

In a preferred embodiment, the mould 21 comprises one or more removable walls 23, 24 in such a way as to allow variation of the size of the panel to be made and to guarantee modularity during the production step. The mould preferably comprises two removable walls 23, 24.

Products for facilitating panel 1 detachment from the mould 21 may be applied. There may also be a step of treatment of the first transparent surface 5, before or after panel 1 detachment from the mould 21.

The invention claimed is:

1. A thermophotovoltaic panel, comprising:
    a first receiving surface for receiving solar radiation,
    photovoltaic cells connected to the first surface,
    a heat exchanger connected to the photovoltaic cells, and
    a second supporting surface, opposite to the first receiving surface, for supporting the panel,
    the heat exchanger being positioned between the first receiving surface and the second supporting surface,
    a resin in which the photovoltaic cells and the heat exchanger are embedded to constitute a body comprising the first receiving surface and the second supporting surface,
    wherein the resin includes a first layer at the first receiving surface and the first layer is a transparent resin;
    wherein the resin includes a second layer at the second supporting surface and the second layer has thermal insulating properties.

2. The thermophotovoltaic panel according to claim 1, wherein the first layer surrounds the photovoltaic cells.

3. The thermophotovoltaic panel according to claim 1, wherein the second layer at least partly surrounds the heat exchanger.

4. The thermophotovoltaic panel according to claim 1, wherein the heat exchanger comprises at least one central body including flow channels for a fluid.

5. The thermophotovoltaic panel according to claim 4, wherein the at least one central body includes a plurality of central bodies that are adjacent and fixed to each other.

6. The thermophotovoltaic panel according to claim 4, wherein the heat exchanger comprises a first closing manifold connected to a first end of the at least one central body, and a second closing manifold connected to a second end of the at least one central body, wherein at least one chosen from the first and the second closing manifolds has a substantially trapezoidal cross-section.

7. The thermophotovoltaic panel according to claim 4, wherein the heat exchanger comprises at least one intermediate body and an end body, with the at least one intermediate body being positioned between the at least one central body and the end body, wherein the end body constitutes a manifold and includes an infeed hole for the fluid and wherein the intermediate body includes flow channels for the fluid.

8. The thermophotovoltaic panel according to claim 4, wherein the heat exchanger comprises a first end body and a second end body, wherein at least one chosen from the first and the second end bodies comprises a first portion having a substantially triangular cross-section and including channels and a second portion having a substantially triangular cross-section and including an infeed hole for the fluid.

9. The thermophotovoltaic panel according to claim 1, configured as a floor tile or a roofing tile.

10. The thermophotovoltaic panel according to claim 1, and further comprising at least one chosen from an electric contact and a hydraulic coupling, at least partly positioned in the second supporting surface.

11. The thermophotovoltaic panel according to claim 1, wherein the second supporting surface comprises at least one groove configured as a seat for pipes or supports to be connected to the panel.

12. A method for making a thermophotovoltaic panel, comprising the steps of:
providing a thermophotovoltaic panel, comprising:
a first receiving surface for receiving solar radiation,
photovoltaic cells connected to the first receiving surface,
a heat exchanger connected to the photovoltaic cells, and
a second supporting surface, opposite to the first receiving surface, for supporting the panel,
the heat exchanger being positioned between the first receiving surface and the second supporting surface,
a resin in which the photovoltaic cells and the heat exchanger are embedded to constitute a body comprising the first receiving surface and the second supporting surface,
wherein the resin includes a first layer at the first receiving surface and the first layer is a transparent resin,
wherein the resin includes a second layer at the second supporting surface and the second layer has thermal insulating properties,
making a mold,
placing the heat exchanger and the photovoltaic cells in the mold,
cold pouring the resin into the mold,
removing the panel from the mold.

13. The method according to claim 12, and further comprising pouring the second layer into the mold and waiting for the second layer to solidify, then pouring the first layer.

14. The method according to claim 12, wherein the mold comprises at least one removable element for making panels of different sizes.

15. The method according to claim 12, wherein the resin is a cold-polymerized epoxy resin.

16. The thermophotovoltaic panel according to claim 1, wherein the resin is a cold-polymerized epoxy resin.

17. The thermophotovoltaic panel according to claim 1, wherein the second layer is an opaque resin.

18. The thermophotovoltaic panel according to claim 4, wherein the central body is made of aluminum alloy.

* * * * *